United States Patent
Chen et al.

(10) Patent No.: US 7,384,853 B2
(45) Date of Patent: Jun. 10, 2008

(54) METHOD OF PERFORMING SALICIDE PROCESSES ON MOS TRANSISTORS

(75) Inventors: Ming-Tsung Chen, Hsin-Chu Hsien (TW); Chang-Chi Huang, Miao-Li Hsien (TW); Po-Chao Tsao, Taipei Hsien (TW)

(73) Assignee: United Microelectronics Corp., Hsin-Chu (TW)

( * ) Notice: Subject to any disclaimer, the term of this patent is extended or adjusted under 35 U.S.C. 154(b) by 132 days.

(21) Appl. No.: 11/161,990

(22) Filed: Aug. 25, 2005

(65) Prior Publication Data

US 2007/0049014 A1  Mar. 1, 2007

(51) Int. Cl.
*H01L 21/331* (2006.01)

(52) U.S. Cl. .............. 438/376; 438/375; 438/374; 438/301; 438/E21.165

(58) Field of Classification Search .............. 438/514, 438/581–580, 583–582
See application file for complete search history.

(56) References Cited

U.S. PATENT DOCUMENTS

| | | | | |
|---|---|---|---|---|
| 5,429,972 A | * | 7/1995 | Anjum et al. | 438/398 |
| 5,691,225 A | * | 11/1997 | Abiko | 438/199 |
| 6,284,611 B1 | * | 9/2001 | Tien et al. | 438/301 |
| 7,071,067 B1 | * | 7/2006 | Ahmad | 438/302 |

* cited by examiner

*Primary Examiner*—Dung A. Le
(74) *Attorney, Agent, or Firm*—Winston Hsu

(57) ABSTRACT

A method of performing salicide processes on a MOS transistor, wherein the MOS transistor comprises a gate structure and a source/drain region, the method comprising: performing a selective growth process to form a silicon layer on the top of the gate and the source/drain region; performing an ion implantation process to form a retarded interface layer between the silicon layer and the gate and source/drain region; forming a metal layer on the silicon layer; and reacting the metal layer with the silicon layer for forming a silicide layer.

7 Claims, 5 Drawing Sheets

METHOD OF PERFORMING SALICIDE PROCESSES ON MOS TRANSISTORS

BACKGROUND OF THE INVENTION

1. Field of the Invention

The present invention relates to a method of fabricating semiconductor devices, and more particularly, to a method of performing salicide processes on MOS transistors.

2. Description of the Prior Art

Field effect transistors are important electronic devices in the fabrication of integrated circuits, and as the size of the semiconductor device becomes smaller and smaller, the fabrication of the transistors also improves and is constantly enhanced for fabricating transistors with smaller sizes and higher quality.

In the conventional method of fabricating transistors, a gate structure is first formed on a substrate, and a lightly doped drain (LDD) is formed on the two corresponding sides of the gate structure. Next, a spacer is formed on the sidewall of the gate structure and an ion implantation process is performed to form a source/drain region within the substrate by utilizing the gate structure and spacer as a mask. In order to incorporate the gate, source, and drain into the circuit, contact plugs are often utilized for interconnection purposes, in which the contact plugs are composed of conducting metals such as tungsten and copper. Nevertheless, the interconnection between the contact plugs and the silicon material of the gate structure and the source/drain region is usually poor, hence a silicide material is often formed over the surface of the gate structure and the source/drain region to improve the ohmic contact between the contact plugs and the gate structure and the source/drain region. Today, the process known as self-aligned silicide (salicide) process has been widely utilized to fabricate silicide materials, in which a source/drain region is first formed, a metal layer comprised of cobalt, titanium, or nickel is disposed on the source/drain region and the gate structure, and a rapid thermal process (RTP) is performed to react the metal layer with the silicon contained within the gate structure and the source/drain region to form a metal silicide for reducing the sheet resistance of the source/drain region.

However, when the silicides are being formed, the atoms within the metal layer will diffuse into the substrate and deplete the silicon within the source/drain region, thereby damaging the original lattice structure of the source/drain region and causing the PN junction between the source/drain region and the silicon substrate to react with the silicon contained within the source/drain region as a result of an overly short distance between the PN junction and the silicide layer. Ultimately, the problems become much worse in the design of ultra shallow junctions (USJ) as the silicides often come in contact directly with the substrate and result in failure of the device.

Please refer to FIG. 1 and FIG. 2. FIG. 1 and FIG. 2 are perspective diagrams showing the fabrication of a conventional field effect transistor. As shown in FIG. 1, a gate structure 106 having a gate dielectric layer 102 and a gate electrode 104 is first formed on a substrate 100. Next, an ion implantation process is performed to form a lightly doped drain 110 in the substrate 100. Next, a liner 107 and a spacer 108 are formed on the sidewall of the gate structure 106 and another ion implantation is performed to form a source/drain region 112 in the substrate 100. Next, a sputtering process is performed to form a metal layer 114 over the surface of the gate electrode 104, the spacer 108, and the substrate 100.

Subsequently, as shown in FIG. 2, a rapid thermal process (RTP) is performed to react the contact area between the metal layer 114 and the gate electrode 104 and the source/drain region 112 into a silicide layer 116.

In order to prevent the short channel effect of the transistors and improve the interconnect resistance of the integrated circuit, the junction depth of the source and drain needs to be effectively reduced for fabricating transistors containing silicides. However, if the thickness of the silicides on the source and drain is decreased while reducing the junction depth of the source and drain, the interconnect resistance and contact resistance may increase simultaneously. On the other hand, if the depth of the silicides is kept constant, the distance between the PN junction of the source/drain region 112 and the silicon substrate and the silicide layer 116 may become overly short and result in junction leakage and a piping effect.

SUMMARY OF THE INVENTION

It is therefore an objective of the present invention to provide a method of performing salicide process on a MOS transistor to solve the above-mentioned problems.

According to the present invention, a method of performing salicide processes on a MOS transistor, wherein the MOS transistor comprises a gate structure and a source/drain region, the method comprising: performing a selective growth process to form a silicon layer on the top of the gate and the source/drain region; performing an ion implantation process to form a retarded interface layer between the silicon layer and the gate and source/drain region; forming a metal layer on the silicon layer; and reacting the metal layer with the silicon layer for forming a silicide layer.

Additionally, the present invention discloses a metal oxide semiconductor (MOS) transistor, in which the MOS transistor comprises: a semiconductor substrate; a gate disposed on the semiconductor substrate, wherein the gate comprises two sidewalls; a spacer formed on the sidewalls of the gate; a source/drain region disposed in the semiconductor substrate; a silicide layer disposed on top of the gate and the surface of the source/drain region; and a retarded interface layer disposed in the junction between the silicide layer and the gate and source/drain region.

By performing an ion implantation process before or after disposing an epitaxial layer on the top of the gate and the surface of the source/drain region, the present invention is able to utilize a retarded dopant as a retarded interface layer to stop the reaction of the salicide fabrication, thereby improving problems such as junction leakage and nickel silicide piping effect.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
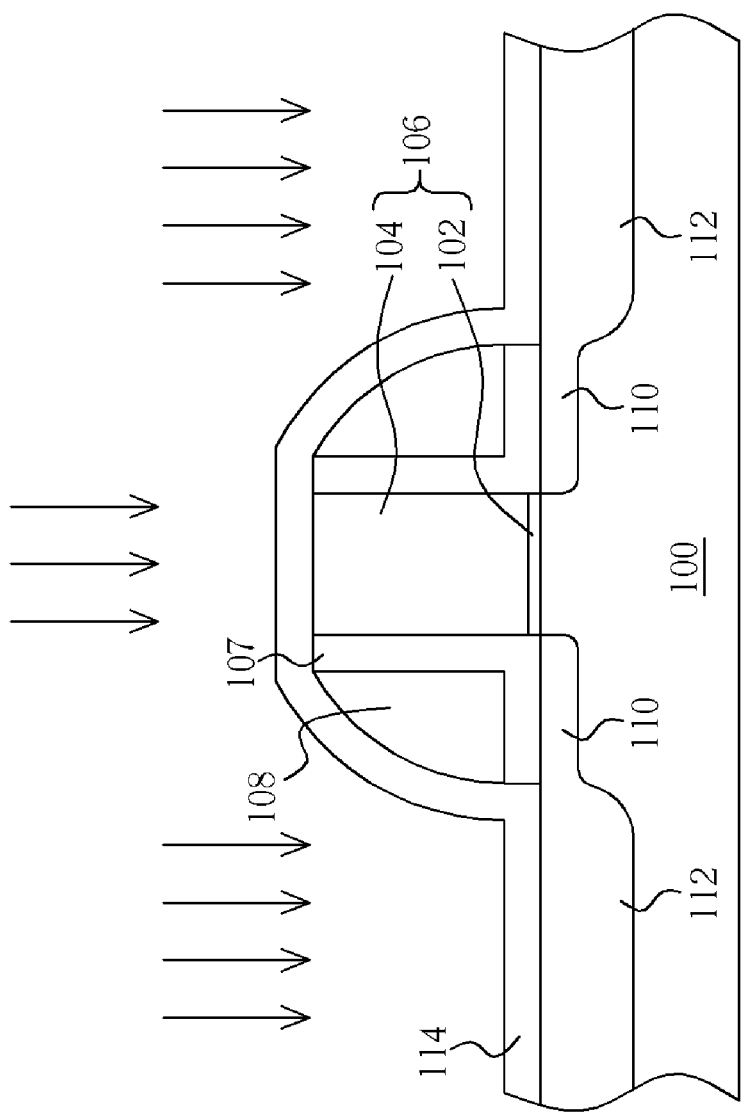
FIG. 1 and FIG. 2 are perspective diagrams showing the fabrication of a conventional field effect transistor.
Figure 2:
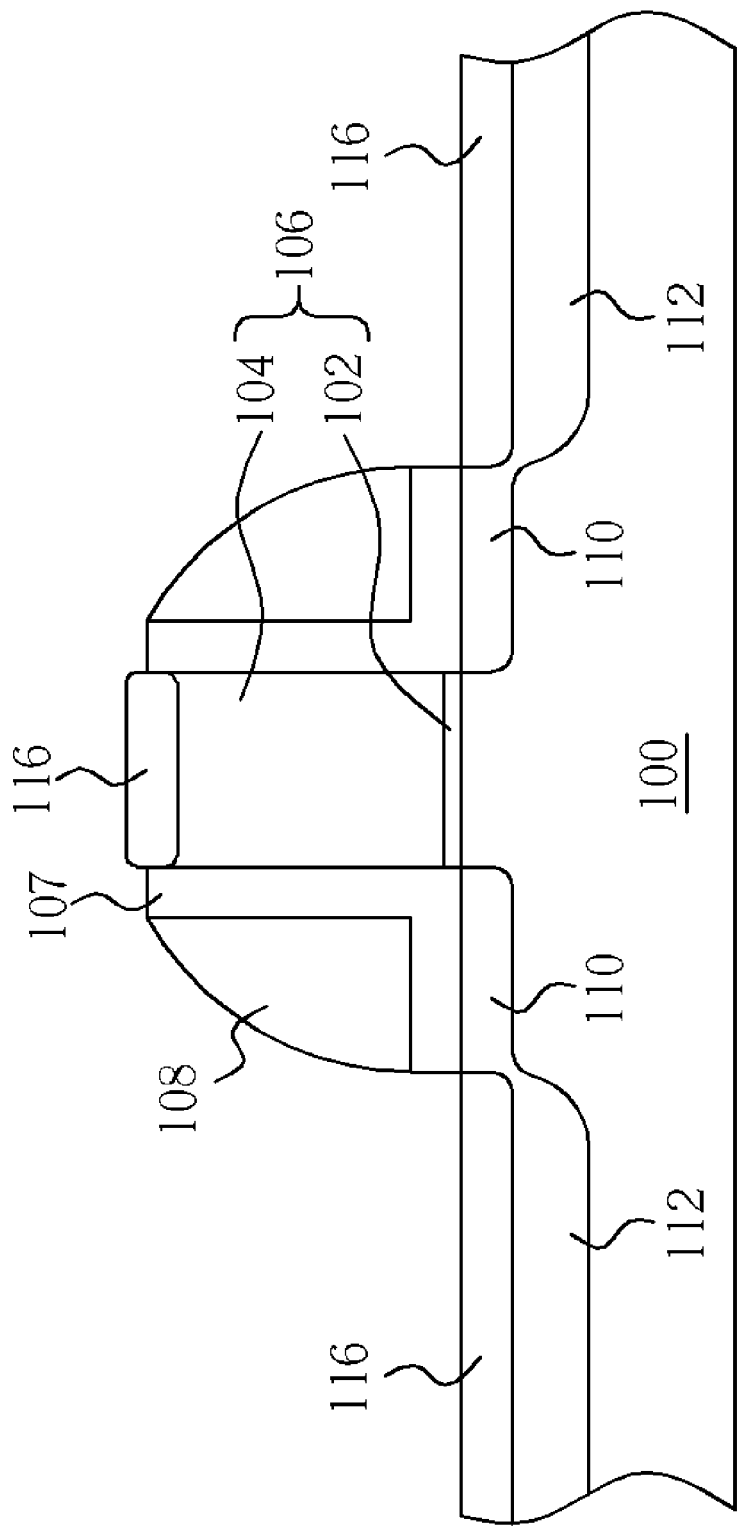
Figure 3:
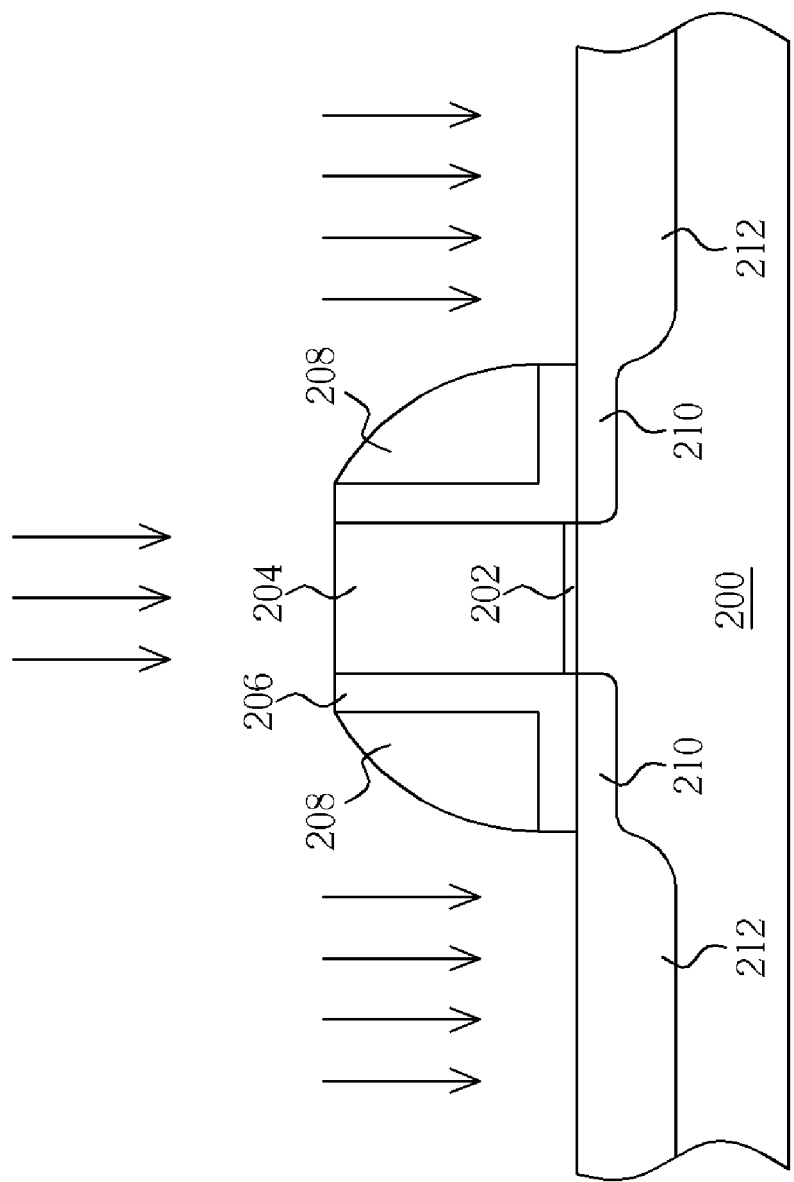
FIG. 3 through FIG. 5 are perspective diagrams showing the means of fabricating a transistor containing silicides according to the present invention.
Figure 4:
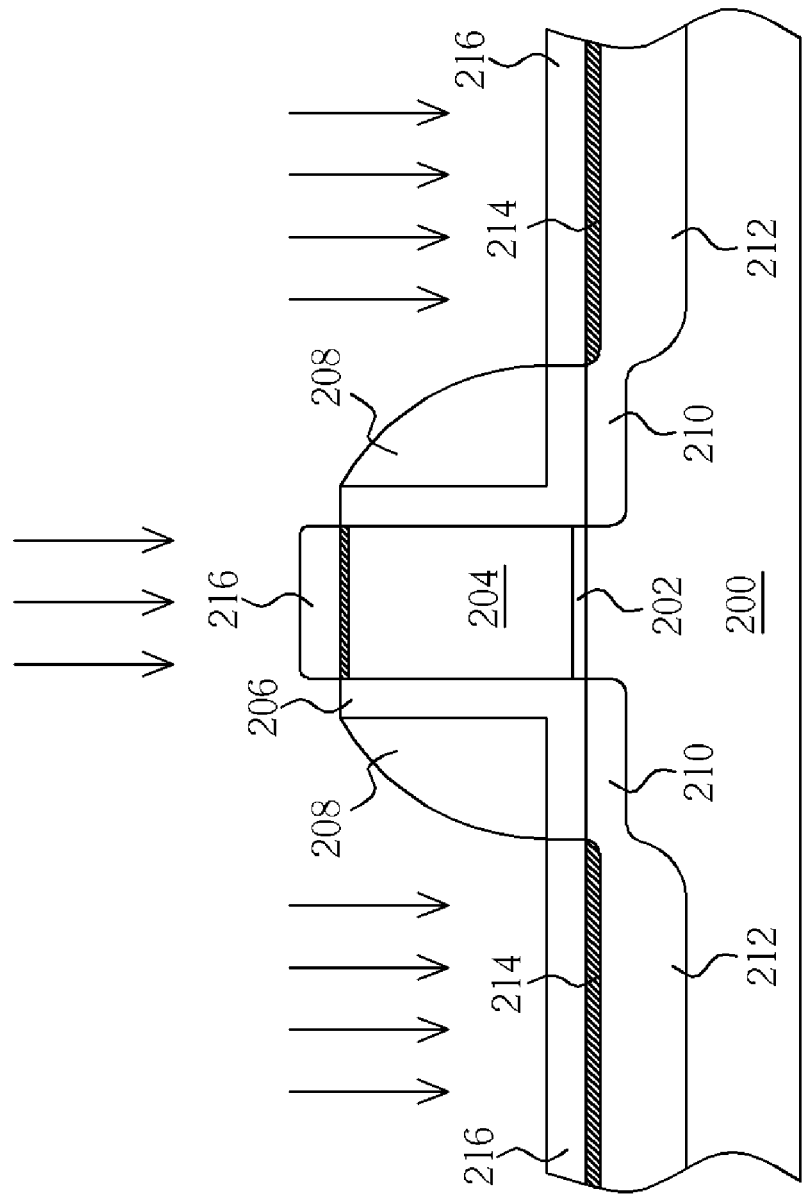
Figure 5:
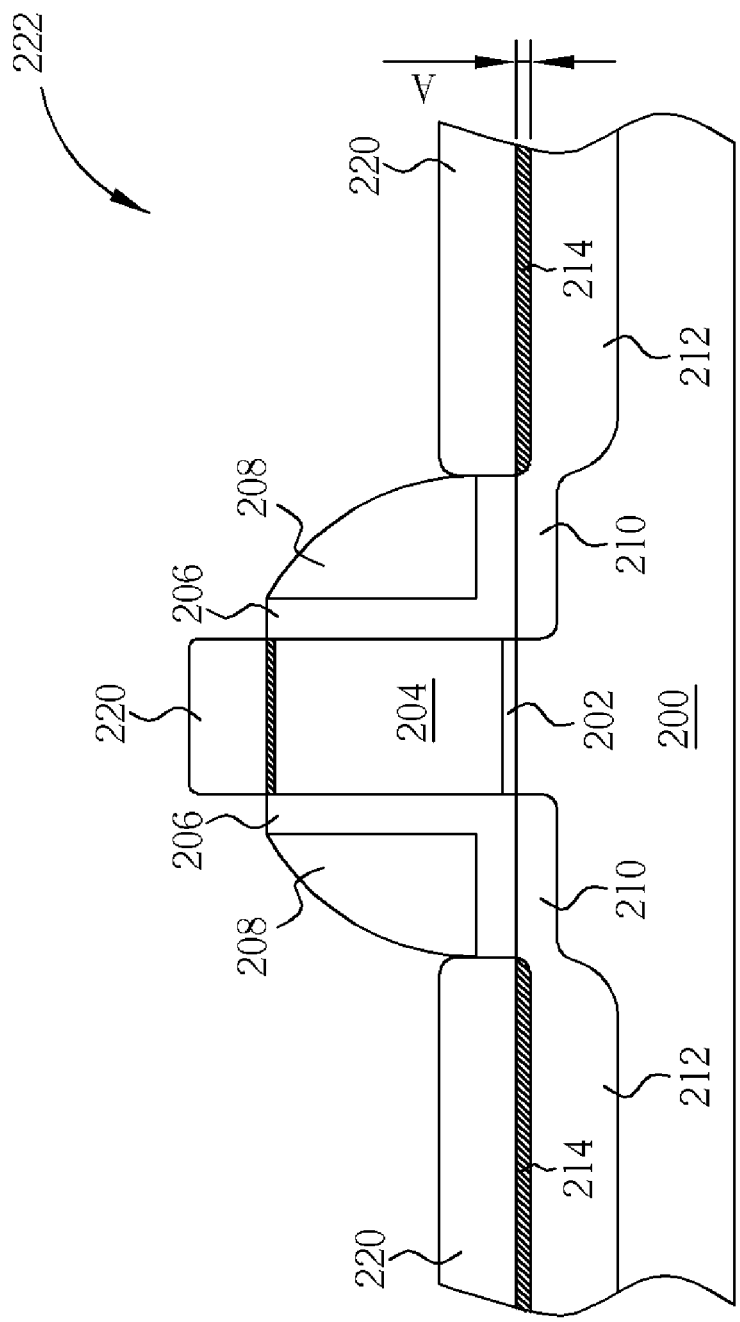

Please refer to FIG. 3 through FIG. 5. FIG. 3 through FIG. 5 are perspective diagrams showing the means of fabricating a transistor containing silicides according to the present invention. As shown in FIG. 3, a substrate 200 is first provided and a gate structure having a gate dielectric layer 202 and a gate 204 is formed over the surface of the substrate 200, in which the gate 204 is composed of conductive materials such as doped polysilicon.

Next, a lightly doped ion implantation is performed to implant a light dopant (not shown) into two sides of the substrate 200 corresponding to the gate 204 to form a source/drain extension region 210 by utilizing the gate 204 as a mask. Next, a liner 206, such as a silicon oxide layer, is deposited around the gate structure and a spacer 208 is formed over the surface of the liner 206, in which the spacer 208 is composed of a silicon oxide offset spacer and a silicon nitride spacer. Next, a heavily doped ion implantation is performed to implant a heavy dopant (not shown) into the substrate 200 to form a source/drain region 212 with heavier dopant concentration by utilizing the gate 204 and the spacer 208 as a mask. Next, a thermal annealing process utilizing a temperature ranging from 1000° C. to 1020° C. is performed to activate the dopants within the substrate 200 and repair the damage of the crystal lattice structure of the substrate 200 during the ion implantation process.

Next, a low temperature selective epitaxial growth (SEG) is performed to form an epitaxial layer 216 over the surface of the source/drain extension region 210 and the source/drain region 212, in which the epitaxial layer 216 is composed of silicon germanium, as shown in FIG. 4. Next, another ion implantation process is performed to implant a retarded dopant 214, such as fluoride ions, nitrogen, and oxygen, into the junction area between the epitaxial layer 216 and the source/drain region 212 and the gate 204 to form a retarded interface layer. Alternatively, depending on the retarded property of the dopants, a surface treatment, such as an ion implantation process, a plasma treatment, or a gas or liquid treatment containing high concentration dopants with retarded property can be performed on the surface of the gate 204, the source/drain extension region 210, and the source/drain region 212 to form the retarded interface layer containing dopants with retarded effects before performing the low temperature selective epitaxial growth to form the epitaxial layer 216.

Next, a surface cleaning process is performed to completely remove the native oxides and other impure materials remaining on the surface of the epitaxial layer 216 and a sputtering or deposition process is performed to form a metal layer (not shown) on the epitaxial layer 216, in which the metal layer is composed of cobalt, titanium, nickel, platinum, palladium, and molybdenum. Subsequently, as shown in FIG. 5, a rapid thermal process (RTP) is performed to react the metal layer with the epitaxial layer 216 deposited earlier to form a silicide layer 220 over the top of the gate 204 and the source/drain region 212 and the non-reacted portion of the metal layer is removed afterwards.

Since the dopants are implanted into the surface of the gate 204 and the source/drain region 212 via the ion implantation process performed earlier, the reaction between the metal layer and the epitaxial layer 216 will ideally stop at the retarded interface layer. In other words, the present invention is able to effectively utilize the location of the retarded interface layer and the thickness of the epitaxial layer 216 to accurately control the thickness and depth of the silicide layer 220, thereby adjusting the contact resistance and improving conventional problems such as junction leakage, which is caused by an overly short distance between the source, drain, and substrate of the PN junction and the silicides, and nickel silicide piping effect, which is caused by the approach of silicides into the channel area during silicide reactions. Additionally, since the epitaxial layer 216 will be reacted completely to form the silicide layer 220, the present invention is able to replace the selectively epitaxial growth (SEG) process described earlier with a low temperature selective polysilicon growth process to form a polysilicon layer over the surface of the source/drain extension region 210 and the source/drain region 212.

As shown in FIG. 5, after the fabrication process is completed, a transistor 222 having silicide structure is obtained, in which the transistor 222 includes a substrate 200, a gate 204 formed on the substrate 200, a gate dielectric layer 202 formed under the gate 204, a spacer 208 formed over the surface of the sidewall of the gate 204, a liner 206 formed between the sidewall of the gate 204 and the spacer 208, and a silicide layer 220 formed on top of the gate 204 and two sides of the substrate 200 corresponding to the spacer 208. Additionally, a source/drain region 212 and a source/drain extension region 210 are formed within the substrate 200. Preferably, a retarded dopant 214 is included between the source/drain region 212 and the silicide layer 220 to form a retarded interface layer, in which the dopant is implanted by an ion implantation process and fluoride ions, nitrogen, and oxygen are utilized as the ion source.

Overall, the advantage of the present invention is to perform an ion implantation process before or after disposing an epitaxial layer on the top of the gate and the surface of the source/drain region. Eventually, the retarded dopant injected is to be utilized as a retarded interface layer to stop the reaction of the salicide fabrication, thereby improving problems such as junction leakage, which is caused by an overly short distance between the source, drain, and substrate of the PN junction and the silicides, and nickel silicide piping effect, which is caused by the approach of silicides into the channel area during silicide reactions. Additionally, a thicker epitaxial is formed over the surface of the gate and the source/drain region as the epitaxial layer will be reacted into a silicide layer in the final stage of the process, thereby reducing the sheet resistance of the source/drain region. Consequently, the present invention is able to obtain a field effect transistor with much better ultra shallow junction structure and source/drain region with lower sheet resistance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of performing salicide processes on a MOS transistor, wherein the MOS transistor comprises a gate structure and a source/drain region, the method comprising:
    performing a selective growth process to form a silicon layer on the top of the gate structure and the source/drain region;
    performing an ion implantation process to inject a retarded dopant into the junction between the silicon layer and the gate structure and the source/drain region;
    forming a metal layer on the silicon layer; and
    reacting the metal layer with the silicon layer for forming a silicide layer.

2. The method of claim 1, wherein the MOS transistor is formed on a substrate and the gate structure further comprises a gate dielectric layer, a gate, and at least a spacer formed on the sidewall of the gate.

3. The method of claim 1, wherein the retarded dopant comprises fluoride ions, nitrogen, and oxygen.

4. The method of claim 1, wherein the metal layer comprises nickel, platinum, palladium, molybdenum, or any alloy thereof.

5. The method of claim 1, wherein the selective growth process comprises a low temperature selective epitaxial growth process and the silicon layer is an epitaxial layer.

6. The method of claim 5, wherein the epitaxial layer comprises silicon germanium (SiGe).

7. The method of claim 1, wherein the selective growth process comprises a low temperature polysilicon growth process and the silicon layer is a polysilicon layer.

* * * * *